United States Patent
Chae (10) Patent No.: US 7,262,452 B2
(45) Date of Patent: Aug. 28, 2007

(54) METHOD OF FORMING DRAM DEVICE HAVING CAPACITOR AND DRAM DEVICE SO FORMED

(75) Inventor: Hee-Il Chae, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 92 days.

(21) Appl. No.: 11/301,962

(22) Filed: Dec. 13, 2005

(65) Prior Publication Data

US 2006/0138516 A1   Jun. 29, 2006

(30) Foreign Application Priority Data

Dec. 27, 2004   (KR) .................... 10-2004-0113188

(51) Int. Cl.
*H01L 27/108* (2006.01)
(52) U.S. Cl. .................. 257/301; 257/302; 257/300; 257/E27.092; 257/E27.095; 257/E29.346; 257/E21.396; 257/296; 257/68; 257/71; 257/E27.084; 257/E21.646; 257/306
(58) Field of Classification Search ............ 257/301, 257/302, 300, E27.092
See application file for complete search history.

(56) References Cited

U.S. PATENT DOCUMENTS

2001/0050388 A1 * 12/2001 Hamamoto ............ 257/301
2003/0030091 A1 * 2/2003 Bulsara et al. ............ 257/301
2006/0189057 A1 * 8/2006 Delpech et al. .......... 438/197
2007/0057302 A1 * 3/2007 Ho et al. .................. 257/301

FOREIGN PATENT DOCUMENTS

| KR | 1996-0026868 | 7/1996 |
| KR | 1999-004603 | 1/1999 |
| KR | 1020020071993 A | 9/2002 |
| KR | 1020030056842 A | 7/2003 |
| KR | 10-2004-0059486 | 7/2004 |

* cited by examiner

*Primary Examiner*—Matthew C. Landau
*Assistant Examiner*—Mohammad Timor Karimy
(74) *Attorney, Agent, or Firm*—Mills & Onello LLP (57) ABSTRACT

In a method of forming a DRAM device having a capacitor and a DRAM device so formed, an interlayer dielectric having at least one layer is formed on a semiconductor substrate. The interlayer dielectric layer and a predetermined portion of the semiconductor substrate are sequentially etched to form a storage node hole. A lower electrode is conformally formed in the storage node hole and on the interlayer dielectric layer. A planarization process is performed to remove a portion of the lower electrode layer that lies on the interlayer dielectric layer and to form a lower electrode in the storage node hole. A dielectric layer and an upper electrode layer are sequentially formed on the lower electrode. The upper electrode layer and the dielectric layer are sequentially patterned.

3 Claims, 6 Drawing Sheets

METHOD OF FORMING DRAM DEVICE HAVING CAPACITOR AND DRAM DEVICE SO FORMED

PRIORITY STATEMENT

This U.S. non-provisional patent application claims priority under 35 U.S.C. § 119 to Korean Patent Application 2004-113188 filed on Dec. 27, 2004, the entire contents of which are hereby incorporated by reference.

BACKGROUND OF THE INVENTION

1. Field of the Invention

The present invention relates to a semiconductor device and methods forming the same, and more particularly to a DRAM device having a capacitor and a DRAM device so formed.

2. Description of the Related Art

In semiconductor devices such as Dynamic Random Access Memory devices (DRAMs), each cell is composed of a transistor and a capacitor. In DRAMs, cells require periodic reading and refreshing operations. Owing to the advantage of low price per unit bit, high integration, and capability for simultaneous read/write operations, DRAMs have been widely used in commercial applications. In the meantime, a "soft" error in the form of a loss of charge stored in a capacitor can be caused by external factors in a DRAM, thereby inducing mis-operation in the DRAM. In order to prevent such a soft error, methods of enhancing the capacitance of a capacitor have been suggested.

The capacitance of the capacitor can be enhanced by increasing the surface area of the lower electrode. Although many studies have investigated techniques for increasing the surface area of lower electrodes, technical challenges are presented in practical manufacturing processes for forming such devices due to the ever-increasing integration of semiconductor devices.

SUMMARY OF THE INVENTION

The present invention is directed to a highly integrated semiconductor device including a capacitor with improved capacitance and a method for forming the same.

In one aspect, the present invention is directed to a capacitor of a semiconductor device according to the present invention. The capacitor comprises a lower electrode formed through at least one interlayer dielectric layer stacked on a semiconductor substrate and through a predetermined portion of the semiconductor substrate, wherein an upper surface of the lower electrode has the same height as that of the interlayer dielectric layer; a dielectric layer coating an inner sidewall and a bottom of the lower electrode, and a portion of the interlayer dielectric layer around a top of the lower electrode; and an upper electrode on the dielectric layer.

In another aspect, the present invention is directed to a method of forming a capacitor. At least one interlayer dielectric layer is formed on a semiconductor substrate. The interlayer dielectric layer and a predetermined portion of the semiconductor substrate are sequentially etched to form a storage node hole. A lower electrode layer is formed conformally in the storage node hole and on the interlayer dielectric layer. A planarization process is performed to remove a portion of the lower electrode layer that lies on the interlayer dielectric and to form a lower electrode in the storage node hole. A dielectric layer and an upper electrode are sequentially formed on the lower electrode. The upper electrode layer and the dielectric layer are patterned sequentially.

In one embodiment, the planarization process can be carried out using an etchback process or CMP (Chemical Mechanical Polishing). In another embodiment, after forming the storage node hole, an ion implantation process may be performed in a region of the semiconductor substrate exposed by the storage node hole at least once.

In another aspect, the present invention is directed to a DRAM device comprising: a first well having a first depth in a semiconductor substrate; a second well in the semiconductor substrate having a second depth shallower than the first depth in the first well; a device isolation layer formed at the semiconductor substrate to define an active region; a gate pattern formed on the semiconductor substrate; a first impurity implantation region being formed in the active region at both sides of the gate pattern and having a third depth shallower than the second depth; an interlayer dielectric having at least one layer covering the gate pattern and the semiconductor substrate; a cup-shaped lower electrode through at least one interlayer dielectric layer and through a portion of the semiconductor substrate, the cup-shaped lower electrode located at one side of the gate pattern, wherein an upper surface of the lower electrode has the same height as that of the interlayer dielectric layer; a dielectric layer covering an inner sidewall and a bottom of the lower electrode, and a part of the interlayer dielectric layer around a top of the lower electrode; and an upper electrode on the dielectric layer.

In one embodiment, the lowermost surface of the lower electrode is positioned in the substrate shallower than the first depth and deeper than the second depth. The DRAM device may further comprise a second impurity implantation region formed in the semiconductor substrate in contact with the lower electrode below the second depth and a third impurity implantation region formed in the semiconductor substrate in contact with the lower electrode below the third depth and formed in the second impurity implantation region and the second well. In this case, the first well, the first impurity implantation region, and the third impurity implantation region are doped with impurities of a first type, and the second well and the second impurity implantation region are doped with impurities of a second type.

In another embodiment, the lowermost surface of the lower electrode is positioned in the substrate shallower than the second depth and deeper than the third depth. The DRAM device may further comprise a second impurity implantation region formed in the semiconductor substrate in contact with the lower electrode below the third depth. In this case, the first well, the first impurity implantation, and the second impurity implantation region are doped with an impurity of a first type, and the second well is doped with an impurity of a second type.

In another embodiment, the DRAM device further comprises: an upper interlayer dielectric layer located on the upper electrode and the at least one interlayer dielectric layer; a bit line contact plug formed through the upper interlayer dielectric layer and the at least one interlayer dielectric layer between neighboring two gate patterns and in contact with the semiconductor substrate; and a bit line located on the upper interlayer dielectric layer and in contact with the bit line contact plug.

In another embodiment, the DRAM device further comprises a bit line located in the interlayer dielectric layer, located lower than a height of an upper surface of the lower electrode in the at least one interlayer dielectric layer, and separated from the lower electrode; and a bit line contact plug connecting the bit line to the semiconductor substrate.

In another aspect, the present invention is directed to a method for forming the DRAM device. A first well having a first depth is formed on a semiconductor substrate, and then a second well having a second depth shallower than the first depth is formed. A device isolation layer is formed in the semiconductor substrate to define an active region. A gate pattern is formed on the semiconductor substrate. A first impurity implantation region is formed in the active region at both sides of the gate pattern. The first impurity implantation region has a third depth shallower than the second depth. At least one interlayer dielectric layer located at one side of the gate pattern and a portion of the semiconductor substrate is sequentially patterned to form a storage node hole. A lower electrode layer is formed conformally in the storage node hole and on the interlayer dielectric layer. A planarization process is performed to remove a portion of the lower electrode layer that lies on the interlayer dielectric layer and to form a lower electrode in the storage node hole. A dielectric layer and an upper electrode layer are sequentially formed on the lower electrode. The upper electrode layer and the dielectric layer are sequentially patterned.

In one embodiment, the planarization process is carried out using an etchback process or CMP (Chemical Mechanical Polishing). After forming the storage node hole, an ion implantation process may be performed in a region of the semiconductor substrate exposed by the storage node hole at least once.

In another embodiment, a bottom of the storage node hole is located in the substrate at a position that is shallower than the first depth and deeper than the second depth. In this case, after forming the storage node hole, an ion implantation process is performed to form a second impurity implantation region in the semiconductor substrate exposed by the storage node hole below the second depth, and an ion implantation process is performed to a third impurity implantation region in the second well and the second impurity implantation region exposed by the storage node hole below the third depth. In addition, after forming the storage node hole, an ion implantation process is performed to form a third impurity implantation region in the semiconductor substrate exposed by the storage node hole below the third depth, and an ion implantation process is performed to form a second impurity implantation region in the semiconductor substrate exposed by the storage node hole below the second depth. In this case, the second impurity implantation region is formed to cover the third impurity implantation region. The first well, the first impurity implantation region, and third impurity implantation region are doped with impurities of a first type, and the second well and the second impurity implantation region are doped with impurities of a second type.

In another embodiment, a bottom of the storage node hole is positioned in the substrate at a position that is shallower than the second depth and deeper than the third depth. In this case, after forming the storage node hole, an ion implantation process is performed to form a second impurity implantation region in the semiconductor substrate exposed by the storage node hole below the third depth. The first well, the first ion implantation region, and the second impurity implantation region are doped with impurities of a first type, and the second well is doped with impurities of a second type.

In another embodiment, an upper interlayer dielectric layer is formed on the semiconductor substrate having the upper electrode is formed. A bit line contact plug is formed through the upper interlayer dielectric layer and the at least one interlayer dielectric one layer between neighboring two gate patterns and in contact with the semiconductor substrate. A bit line in contact with the bit line contact plug on the upper interlayer dielectric layer is formed. In addition, forming the at least one interlayer dielectric layer comprises forming a first interlayer dielectric and forming a second interlayer dielectric, and before forming the second interlayer dielectric and subsequent to forming the first interlayer dielectric is followed by: forming a bit line contact plug in contact with the semiconductor substrate through the first interlayer dielectric layer; and forming a bit line in contact with the bit line contact plug on the first interlayer dielectric layer.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS OF THE INVENTION

Hereinafter, example embodiments of the present invention will be described in detail with reference to the accompanying drawings. In the figures, the same reference numerals are used to denote the same elements throughout the drawings.

FIGS. 1 to 8 are procedural sectional views that illustrate a method of forming a DRAM device having a capacitor according to one embodiment of the present invention.

Figure 1:
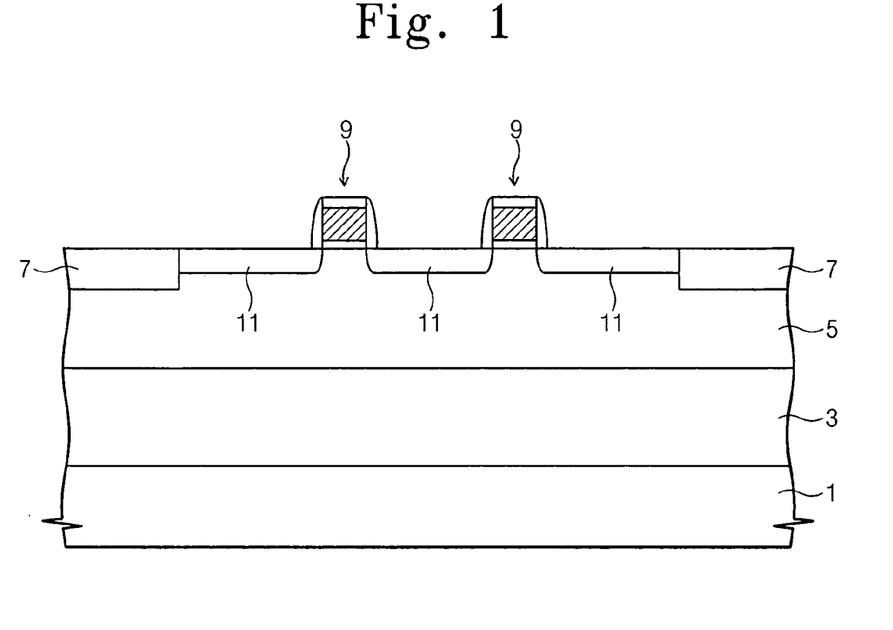
FIGS. 1 to 8 are sectional views that illustrate a method of forming a DRAM device having a capacitor according to an embodiment of the present invention.

Referring to FIG. 1, an ion implantation process is performed with respect to a semiconductor substrate 1 to form a first well 3 having a first depth. In one example, the semiconductor substrate 1 is P-type. The first well 3 can be formed by doping N-type impurities with phosphorus (P) ions or arsenic (As) ions. An ion implantation process is performed to form a second well 2 having a second depth that is shallower than the first depth. The second well 2 may be formed by doping P-type impurities with boron (B) ions. A device isolation layer 7 is formed in the semiconductor substrate 1 in which the first and second wells 3 and 5 are formed to define an active region. The device isolation layer 7 may be formed by a conventional shallow trench isolation (STI) process. A gate pattern 9 including a gate insulation layer, a gate electrode, and a capping pattern is formed on the semiconductor substrate 1. The gate pattern 9 may further include a spacer covering sidewalls of the gate. An ion implantation process is performed with respect to the active region using the gate pattern as an ion implantation mask to form an impurity implantation region 11 for source/drain regions. The impurity implantation region 11 is formed to have a third depth shallower than the second depth or may be formed by doping N-type impurities with phosphor (P) ions or arsenic (As) ions. Preferably, the concentration of impurities for doping the impurity implantation region 11 is higher than that of the first well 3.

Figure 2:
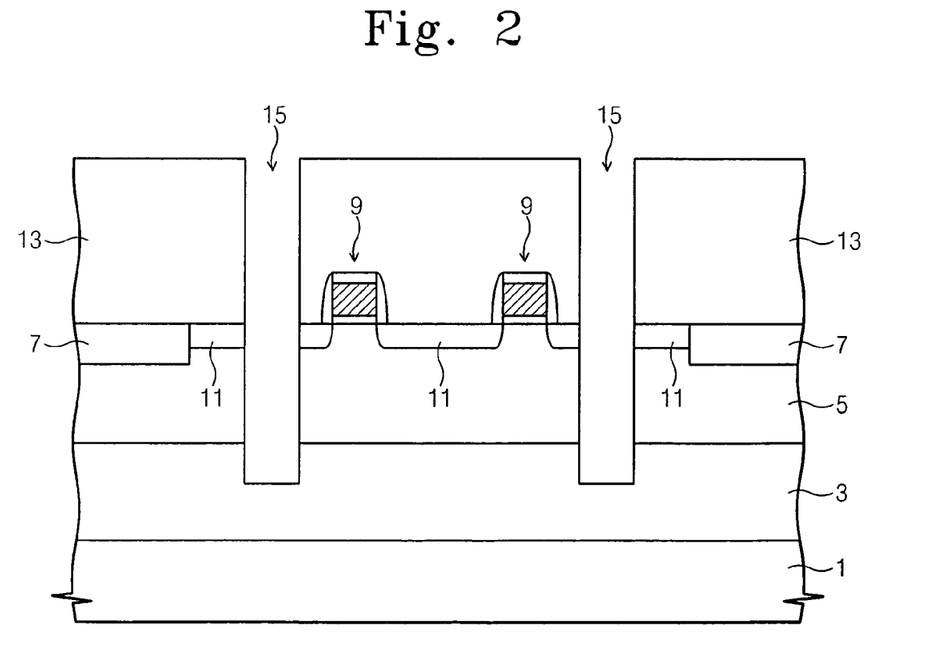

Referring to FIG. 2, an interlayer dielectric layer 13 is formed on the semiconductor substrate 1. The interlayer dielectric layer 13 can be formed of at least one material selected from the group consisting of HSQ (Hydrogen Silsesquioxane), BPPSG (Boron Phosporus Silicate Glass), HDP (High Density Plasma) oxide, PETEOS (Plasma Enhanced Tetraethyl Orthosilicate), USG (Undoped Silicate Glass), $PESiH_4$, and $Al_2O_3$ using at least one method selected from the group consisting of PECVD (Plasma-Enhanced Chemical vapor Deposition), LPCVD (Low-Pressure Chemical Vapor Deposition), ALD (Atomic Layer Deposition), and SOG (Spin On Glass). The interlayer dielectric 13 and a predetermined portion of the semiconductor substrate 1 at one side of the gate pattern 9 are successively etched using a photoresist pattern (not shown) to form a storage node hole 15. In the present embodiment, a bottom of the storage node hole 15 is located in the first well 3.

Figure 3:
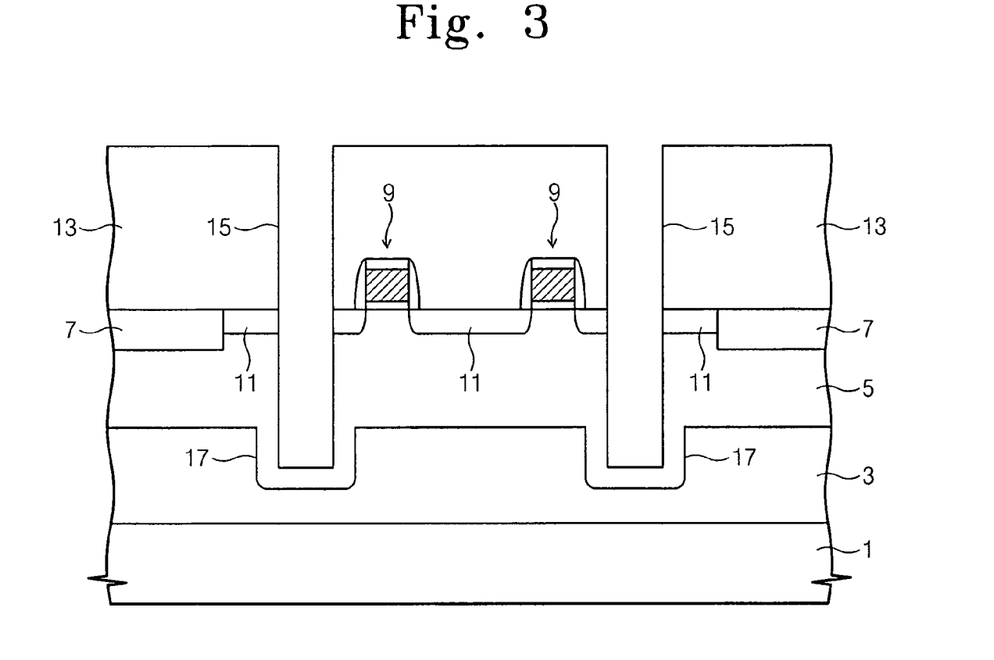

Referring to FIG. 3, an ion implantation process is performed to form a second impurity implantation region 17 in a portion of the semiconductor substrate 1 exposed at the bottom of the storage node hole 15. The second impurity implantation region 17 is formed in the first well 3, and more preferably, may be formed of impurities having the same type, e.g., the same concentration, as the second well 5. By controlling a tilt during the ion implantation process, the second impurity implantation region 17 may be formed at the bottom of the storage node hole 15 as well as a portion of the semiconductor substrate 1 at inner sidewalls of the bottom portion of the storage node hole 15.

Figure 4:
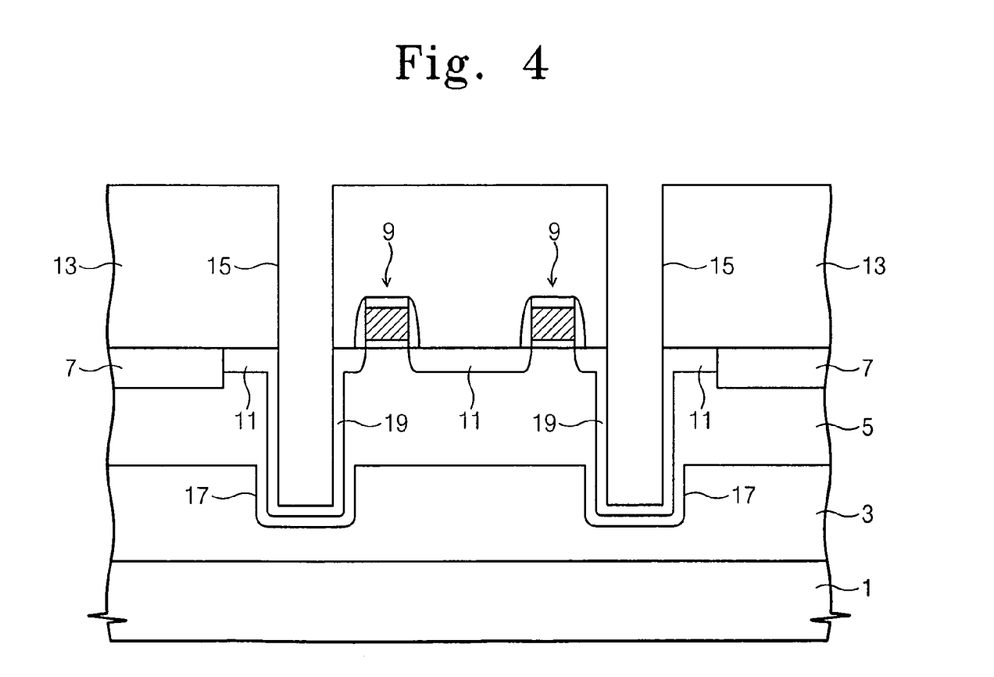

Referring to FIG. 4, while the second impurity implantation region 17 is formed, the ion implantation process is performed again to form a third impurity implantation region 19 in the semiconductor substrate 1 exposed by the storage node hole 15. The third impurity implantation region 19 is formed in the second impurity implantation region 17 and the second well 5. The third impurity implantation region 19 may be formed of impurities having the same type as the first impurity implantation region 11 or having a lower concentration than the first impurity implantation region 11. By controlling the tilt during the ion implantation process, the third impurity implantation region 19 may be formed at the bottom of the storage node 15 as well as a portion of the semiconductor substrate 1 at inner sidewalls of a bottom portion of the storage node hole 15.

The formation sequence of the second impurity implantation 17 and the third impurity implantation region 19 can optionally be changed. In other words, the third impurity implantation region 19 may first be formed, and then followed by formation of the second impurity implantation region 17.

Figure 5:
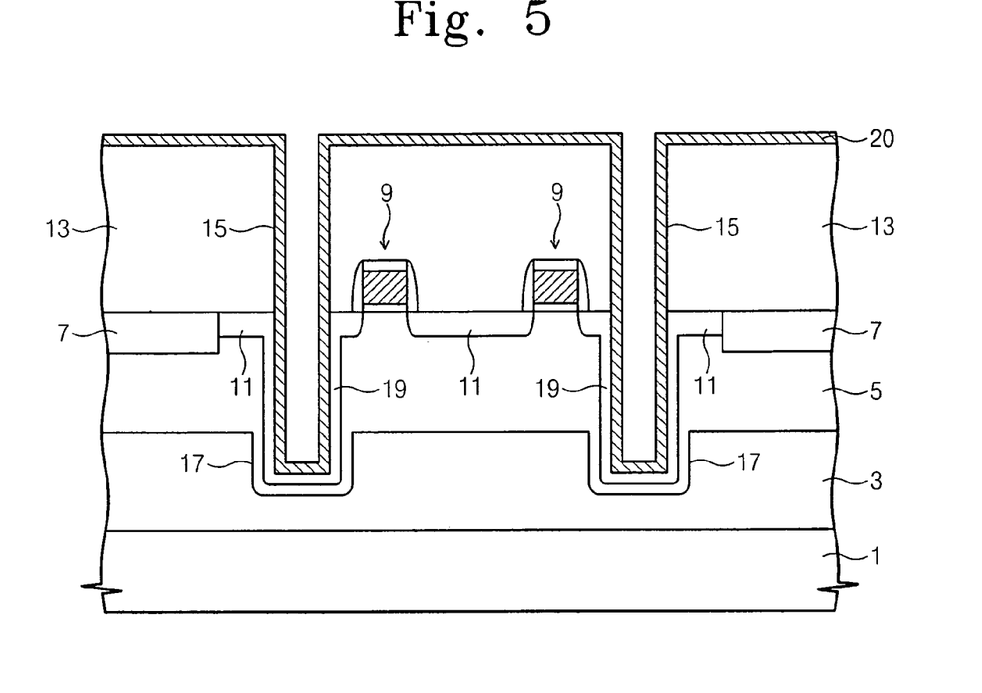

Referring to FIG. 5, a lower electrode layer 20 is conformally formed to cover inner sidewalls and the bottom of the storage node hole 15. The lower electrode layer 20 comprises, for example, a metal-containing layer that is applied using chemical vapor deposition or atomic layer deposition. The lower electrode layer 20 can be formed, for example, of at least one layer selected from the group consisting of polysilicon doped with impurities, titanium, titanium nitride, tantalum, tantalum nitride, tungsten, copper, and aluminum.

Figure 6:
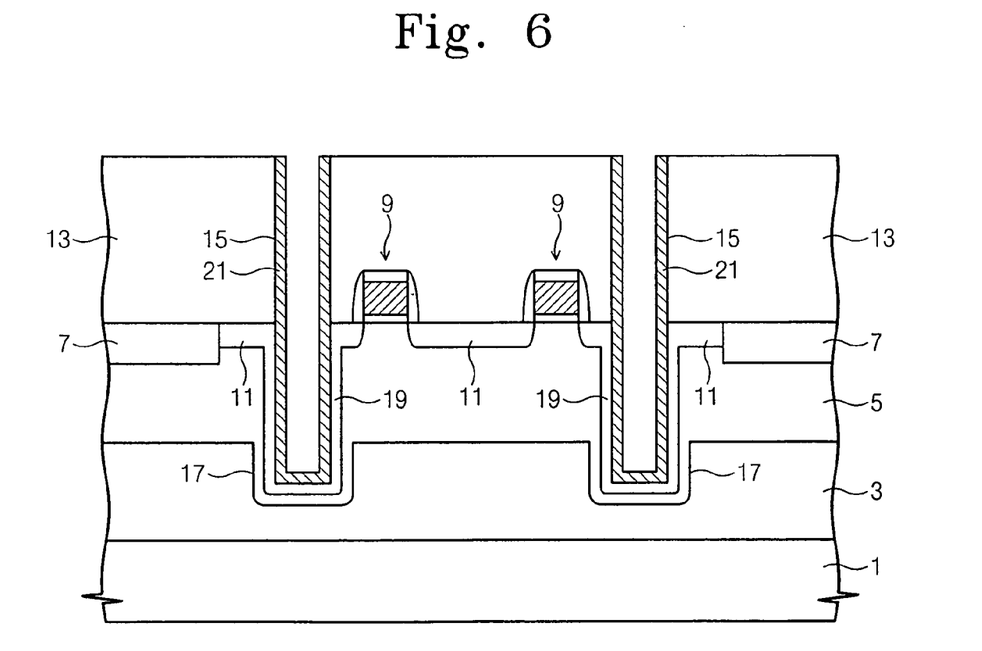

Referring to FIG. 6, a sacrificial layer (not shown) is formed to fill the storage node hole 15. A planarization process is performed to remove the lower electrode layer 20 and the sacrificial layer on the interlayer dielectric 13 to form a lower electrode 21 that covers the inner sidewalls and the bottom of the storage node hole 21. The residual sacrificial layers in the storage node hole 21 are then removed. The planarization process may be a chemical mechanical polishing process or an etchback process. The lower electrode 21 has a cup shape and is formed to have an upper surface that is aligned with the upper surface of the interlayer dielectric 13.

Figure 7:
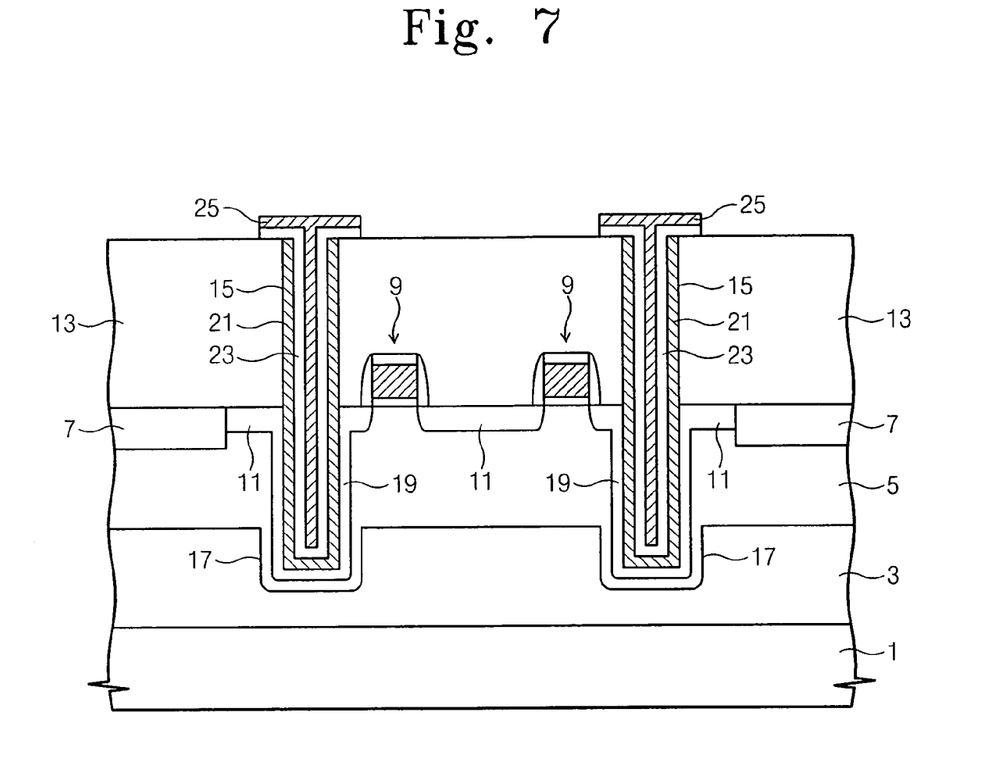

Referring to FIG. 7, a dielectric layer 23 and an upper electrode layer 25 are formed conformally. The dielectric layer 23 and the upper electrode layer 25 are formed, for example, using CVD or ALD. The dielectric layer 23 comprises, for example, a high k-dielectric layer such as tantalum oxide ($Ta_2O_5$), hafnium oxide ($HfO_2$), and aluminum oxide ($Al_2O_3$). The upper electrode layer 25 can be formed of at least one material selected from the group consisting of polysilicon doped with impurities, titanium, titanium nitride, tantalum, tantalum nitride, tungsten, copper, and aluminum. The upper electrode layer 25 and the dielectric layer 23 are sequentially patterned using a photoresist pattern (not shown) as an etch mask to form a dielectric pattern 23 exposing the interlayer dielectric 13 and the upper electrode 25.

Figure 8:
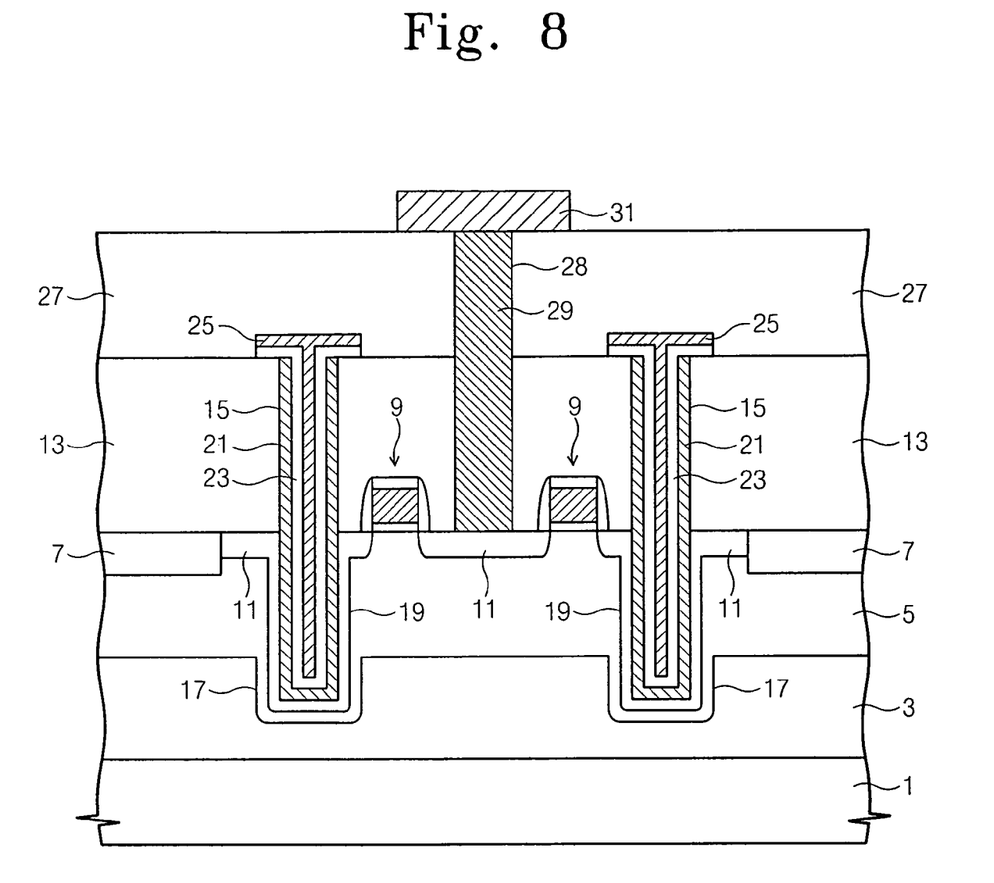

Referring to FIG. 8, an upper interlayer dielectric 27 is formed on an entire surface of the semiconductor substrate 1. The upper interlayer dielectric 27 and the interlayer dielectric 13 between two neighboring gate patterns 9 are successively patterned to form a bit line contact hole 28 exposing the impurity implantation region 11. The bit line contact hole 28 is filled with conductive materials to form a bit line contact plug 29. A conductive layer on the semiconductor substrate 1 is formed and then it is patterned to form a bit line 31 in contact with the bit line contact plug 29.

In accordance with the present invention, since the lower electrode 21 is laterally supported by the interlayer dielectric 13 and a portion of the semiconductor substrate 1, it is possible to increase surface area of the lower electrode without raising the height of the lower electrode above the substrate. As a result, capacitance can be increased. The lower electrode 21 is formed not by a complex photolithography process requiring coating, exposing, and developing process steps, but rather by a planarization process, thereby simplifying fabrication. In addition, an upper surface of the lower electrode 21 is not located on the interlayer dielectric 13, so that the height of the lower electrode may be decreased by as much as the thickness of the lower electrode layer. Furthermore, the second and third impurity implantation regions 17 and 19 perform a function to prevent leakage current from flowing from the lower electrode 21 to the semiconductor substrate 1.

Figure 9:
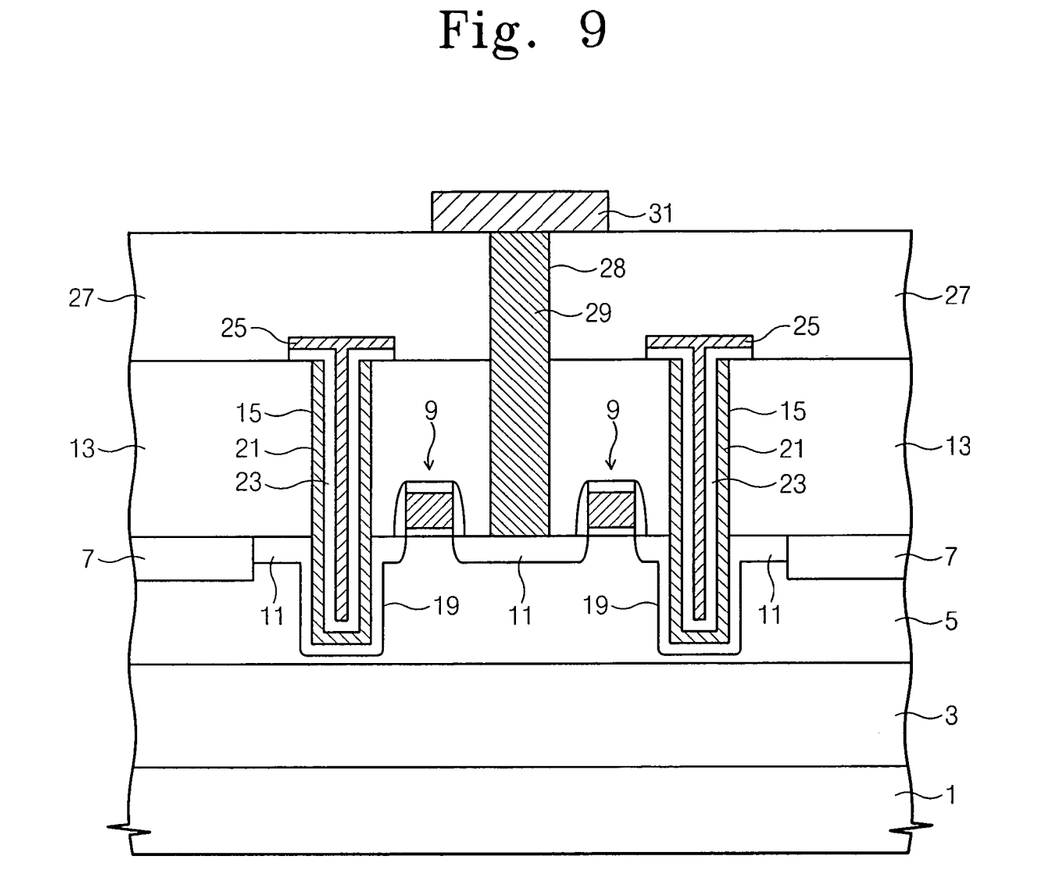
FIG. 9 is a cross-sectional view illustrating a DRAM device having a capacitor according to another embodiment of the present invention.

FIG. 9 is a cross-sectional view of a DRAM device having a capacitor according to another embodiment of the present invention.

Referring to FIG. 9, in this embodiment, the lowermost surface of the lower electrode 21 is located in the second well 5 in accordance with the device design rule. In this case, the second impurity implantation region 17 of the first embodiment dose not exist, and a third impurity implantation region 19 doped with impurities having the same type as the first impurity implantation region 11 is formed so as to cover a lower sidewalls and a bottom of the electrode layer.

The DRAM device illustrated in FIG. 9 can be formed in the following manner. With reference to FIG. 2 above, the interlayer dielectric 13 and the semiconductor substrate 1 are etched so that the bottom of the storage node hole 15 is located at a position in the second well 5. An ion implantation process is performed to form a third impurity implantation region 19 (see FIG. 9) in a region of the semiconductor substrate 1 exposed by the storage node hole 15. The third impurity implantation region 19 is formed in the second well 5. The third impurity implantation region 19 can be formed of impurities having the same type as the first impurity implantation region 11 or having a lower concentration than the first impurity implantation region 11. By controlling tilt during the ion implantation process, the third impurity implantation region 19 can be formed at the bottom of the storage node hole as well as the semiconductor substrate 1 comprising inner sidewalls of the storage node hole. A subsequent process is performed in the same manner as the first embodiment.

Although not shown in the drawings, the interlayer dielectric 13 can optionally be formed using two insulation layers. In this case, the bit line 13 can optionally be positioned at a location that is lower than the upper surface of the lower electrode 15 between the two insulation layers. At this time, the bit line contact plug 29 contacts the bit line 31 and penetrates the lower insulation layer among the insulation layers for connection with the impurity implantation region 11.

According to the present invention, since the lower electrode is laterally supported by the interlayer dielectric and the predetermined portion of the semiconductor substrate, it is possible to increase surface area without raising the height of the lower electrode above the substrate. As a result, capacitance can be increased. The lower electrode is formed not by a complex photolithography process requiring coating, exposing, and developing process steps, but rather by a planarization process, thereby simplifying fabrication. In addition, an upper surface of the lower electrode is not located on the interlayer dielectric, so that the height of the lower electrode may be decreased as much as the thickness of the lower electrode layer. Furthermore, the second and third impurity implantation regions perform a function to prevent leakage current from flowing from the lower electrode to the semiconductor substrate.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. a DRAM device comprising:
    a first well having a first depth in a semiconductor substrate;
    a second well having a second depth shallower than the first depth in the first well;
    a device isolation layer in the semiconductor to define an active region;
    a gate pattern formed on the semiconductor substrate;
    a first impurity implantation region being formed in the active region at both sides of the gate pattern and having a third depth shallower than the second depth;
    at least one interlayer dielectric layer covering the gate pattern and the semiconductor substrate;
    a cup-shaped lower electrode formed through the at least one interlayer dielectric layer and through a portion of the semiconductor substrate, the cup-shaped electrode located at one side of the gate pattern, wherein an upper surface of the lower electrode has the same height as that of the interlayer dielectric layer, wherein a lowermost surface of the lower electrode is positioned in the substrate shallower than the first depth and deeper than the second depth;
    a dielectric layer coating an inner sidewall and a bottom of the lower electrode, and a portion of the interlayer dielectric layer around a top of the lower electrode;
    an upper electrode on the dielectric layer;
    a second impurity implantation region formed in the semiconductor substrate in contact with the lower electrode below the second depth; and
    a third impurity implantation region formed in the semiconductor substrate in contact with the lower electrode below the third depth and formed in the second impurity implantation region and the second well,
    wherein the first well, the first impurity implantation region, and the third impurity implantation region are doped with impurities of a first type, and
    wherein the second well and the second impurity implantation region are doped with impurities of a second type.

2. The DRAM device of claim 1, further comprising:
    an upper interlayer dielectric layer located on the upper electrode and the at least one interlayer dielectric layer;
    a bit line contact plug formed through the upper interlayer dielectric layer and the at least one interlayer dielectric layer between neighboring two gate patterns and in contact with the semiconductor substrate; and
    a bit line located on the upper interlayer dielectric layer and in contact with the bit line contact plug.

3. The DRAM device of claim 1, further comprising:
    a bit line located lower than a height of an upper surface of the lower electrode in the at least one interlayer dielectric layer, and separated from the lower electrode; and
    a bit line contact plug connecting the bit line to the semiconductor substrate.

* * * * *

UNITED STATES PATENT AND TRADEMARK OFFICE
CERTIFICATE OF CORRECTION

PATENT NO. : 7,262,452 B2  Page 1 of 1
APPLICATION NO. : 11/301962
DATED : August 28, 2007
INVENTOR(S) : Hee-Il Chae It is certified that error appears in the above-identified patent and that said Letters Patent is hereby corrected as shown below:

Column 7, line 46 delete "a" and insert --A--
Column 7, line 51 insert --substrate-- after "semiconductor"

Signed and Sealed this

First Day of April, 2008

JON W. DUDAS
*Director of the United States Patent and Trademark Office*